US009214337B2

(12) United States Patent
Carroll et al.

(10) Patent No.: US 9,214,337 B2
(45) Date of Patent: Dec. 15, 2015

(54) PATTERNED SILICON-ON-PLASTIC (SOP) TECHNOLOGY AND METHODS OF MANUFACTURING THE SAME

(71) Applicant: RF Micro Devices, Inc., Greensboro, NC (US)

(72) Inventors: Michael Carroll, Jamestown, NC (US); Julio Costa, Oak Ridge, NC (US); Daniel Charles Kerr, Oak Ridge, NC (US); Don Willis, Kernersville, NC (US); Elizabeth Glass, Oak Ridge, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 14/261,029

(22) Filed: Apr. 24, 2014

(65) Prior Publication Data
US 2014/0252567 A1  Sep. 11, 2014

Related U.S. Application Data

(63) Continuation-in-part of application No. 13/852,648, filed on Mar. 28, 2013.

(60) Provisional application No. 61/815,327, filed on Apr. 24, 2013, provisional application No. 61/816,207, filed on Apr. 26, 2013, provisional application No. 61/773,490, filed on Mar. 6, 2013.

(51) Int. Cl.
*H01L 29/02* (2006.01)
*H01L 21/02* (2006.01)
(Continued)

(52) U.S. Cl.
CPC ........ *H01L 21/0237* (2013.01); *H01L 21/6835* (2013.01); *H01L 23/293* (2013.01);
(Continued)

(58) Field of Classification Search
CPC ............ H01L 21/0237; H01L 21/6835; H01L 23/293; H01L 23/36; H01L 29/786; H01L 29/0657; H01L 21/56; H01L 23/3737; H01L 23/3107; H01L 29/78606; H01L 2221/68381; H01L 2221/68318; H01L 2221/68327; H01L 2221/6834; H01L 2224/13
USPC ........... 257/635, 686, 790; 438/479, 107, 109
See application file for complete search history.

(56) References Cited

U.S. PATENT DOCUMENTS 4,093,562 A * 6/1978 Kishimoto .................... 252/511
4,366,202 A   12/1982 Borovsky
(Continued)

OTHER PUBLICATIONS

Anderson, Thermal Conductivity of Polymers, 1966, Sandia, pp. 677-690, Dec. 1966.*

(Continued)

*Primary Examiner* — Nikolay Yushin
(74) *Attorney, Agent, or Firm* — Withrow & Terranova, P.L.L.C.

(57) ABSTRACT

A semiconductor device and methods for manufacturing the same are disclosed. The semiconductor device includes a semiconductor stack structure attached to a wafer handle having at least one aperture that extends through the wafer handle to an exposed portion of the semiconductor stack structure. A thermally conductive and electrically resistive polymer substantially fills the at least one aperture and contacts the exposed portion of the semiconductor stack structure. One method for manufacturing the semiconductor device includes forming patterned apertures in the wafer handle to expose a portion of the semiconductor stack structure. The patterned apertures may or may not be aligned with sections of RF circuitry making up the semiconductor stack structure. A following step includes contacting the exposed portion of the semiconductor stack structure with a polymer and substantially filling the patterned apertures with the polymer, wherein the polymer is thermally conductive and electrically resistive.

31 Claims, 13 Drawing Sheets

(51) Int. Cl.

| | | |
|---|---|---|
| H01L 23/29 | (2006.01) | |
| H01L 23/36 | (2006.01) | |
| H01L 23/373 | (2006.01) | |
| H01L 21/683 | (2006.01) | |
| H01L 29/786 | (2006.01) | |
| H01L 29/06 | (2006.01) | |
| H01L 23/31 | (2006.01) | |
| H01L 21/56 | (2006.01) | |

(52) U.S. Cl.
CPC ........... *H01L 23/36* (2013.01); *H01L 23/3737* (2013.01); *H01L 29/78606* (2013.01); *H01L 21/568* (2013.01); *H01L 23/3107* (2013.01); *H01L 29/0657* (2013.01); *H01L 2221/6834* (2013.01); *H01L 2221/68318* (2013.01); *H01L 2221/68327* (2013.01); *H01L 2221/68381* (2013.01); *H01L 2224/13* (2013.01)

(56) References Cited

U.S. PATENT DOCUMENTS

| | | | |
|---|---|---|---|
| 5,069,626 | A | 12/1991 | Patterson et al. |
| 5,391,257 | A | 2/1995 | Sullivan et al. |
| 5,709,960 | A * | 1/1998 | Mays et al. .................. 428/698 |
| 6,235,554 | B1 * | 5/2001 | Akram et al. ................ 438/109 |
| 6,236,061 | B1 | 5/2001 | Walpita |
| 6,426,559 | B1 | 7/2002 | Bryan et al. |
| 6,649,012 | B2 | 11/2003 | Masayuki et al. |
| 7,042,072 | B1 * | 5/2006 | Kim et al. .................... 257/678 |
| 7,307,003 | B2 | 12/2007 | Reif et al. |
| 7,393,770 | B2 | 7/2008 | Wood et al. |
| 7,855,101 | B2 | 12/2010 | Furman et al. |
| 8,503,186 | B2 | 8/2013 | Lin et al. |
| 8,772,853 | B2 | 7/2014 | Hong et al. |
| 8,835,978 | B2 | 9/2014 | Mauder et al. |
| 2001/0004131 | A1 | 6/2001 | Masayuki et al. |
| 2004/0166642 | A1 | 8/2004 | Chen et al. |
| 2004/0219765 | A1 | 11/2004 | Reif et al. |
| 2005/0212419 | A1 | 9/2005 | Vazan et al. |
| 2006/0108585 | A1 | 5/2006 | Gan et al. |
| 2006/0261446 | A1 | 11/2006 | Wood et al. |
| 2007/0069393 | A1 | 3/2007 | Asahi et al. |
| 2007/0276092 | A1 | 11/2007 | Kanae et al. |
| 2010/0081232 | A1 | 4/2010 | Furman et al. |
| 2010/0081237 | A1 * | 4/2010 | Wong et al. .................. 438/127 |
| 2011/0026232 | A1 | 2/2011 | Lin et al. |
| 2011/0036400 | A1 | 2/2011 | Murphy et al. |
| 2013/0015429 | A1 | 1/2013 | Hong et al. |
| 2013/0299871 | A1 | 11/2013 | Mauder et al. |

OTHER PUBLICATIONS

Mamunya et al., "Electrical and thermal conductivity of polymers filled with metal powders", 2002, European Polymer Journal, vol. 38, pp. 1887-1897, Feb. 2002.*
Author Unknown, "CoolPoly D5108 Thermally Conductive Polyphenylene Sulfide (PPS)," Cool Polymers, Aug. 8, 2007, 2 pages.
Author Unknown, "CoolPoly D5506 Thermally Conductive Liquid Crystalline Polymer (LCP)," Product Data, Dec. 12, 2013, Cool Polymers, Inc., 2 pages.
Author Unknown, "CoolPoly D-Series—Thermally Conductive Dielectric Plastics", Cool Polymers, Retrieved: Jun. 24, 2013, http://coolpolymers.com/dseries.asp, 1 page.
Author Unknown, "CoolPoly Thermally Conductive Plastics for Substrates and Electronic Packaging," 2005, Cool Polymers, Inc., 1 page.
Author Unknown, "Plastics that Conduct Heat", Plastics Technology Online, Updated: Jun. 2001, Retrieved: Jun. 24, 2013, http://www.ptonline.com/articles/plastics-that-conduct-heat, 4 pages.
Huang, Xingyi et al., "A Review of Dielectric Polymer Composites with High Thermal Conductivity," IEEE Electrical Insulation Magazine, Copyright: 2011, pp. 8-16.
Author Unknown, "Sapphire Substrate," from CRC Handbook of Chemistry and Physics, Date Unknown, Schott Borofloat, 1 page.
Beck, D. et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.
Botula, A. et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.
Carroll, M. et al., "High-Resistivity SOI CMOS Cellular Antenna Switches," Annual IEEE Compound Semiconductor Integrated Circuit Symposium, (CISC 2009), Oct. 2009, pp. 1-4.
Colinage, J.P. et al., "A Low-Voltage, Low-Power Microwave SOI MOSFET," Proceedings of 1996 IEEE International SOI Conference, Oct. 1996, pp. 128-129.
Costa, J., "RFCMOS SOI Technology for 4G Reconfigurable RF Solutions," Session WEC1-2, Proceedings of the 2013 IEEE International Microwave Symposium.
Jung, Boo Yang et al., "Study of FCMBGA with Low CTE Core Substrate," 2009 Electronic Components and Technology Conference, May 2009, pp. 301-304.
Kerr, D.C. et al., "Identification of RF Harmonic Distortion on Si Substrates and its Reduction Using a Trap-Rich Layer," IEEE Topical Meeting on Silicon Monolithic Integrated Circuits in RF Systems, (SiRF 2008), Jan. 2008, pp. 151-154.
Lederer, D. et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lee, Tzung-Yin et al., "Modeling of SOI FET for RF Switch Applications," IEEE Radio Frequency Integrated Circuits Symposium, May 23-25, 2010, Anaheim, CA, IEEE, pp. 479-482.
Parthasarathy, S. et al., "RF SOI Switch FET Design and Modeling Tradeoffs for GSM Applications," 23rd International Conference on VLSI Design, (VLSID '10), Jan. 2010, pp. 194-199.
Raskin, J.P. et al., "Coupling Effects in High-Resistivity SIMOX Substrates for VHF and Microwave Applications," Proceedings of 1995 IEEE International SOI Conference, Oct. 1995, pp. 62-63.
Rong, B. et al, "Surface-Passivated High-Resistivity Silicon Substrates for RFICs," IEEE Electron Device Letters, vol. 25, No. 4, Apr. 2004, pp. 176-178.
Tombak, A. et al., "High-Efficiency Cellular Power Amplifiers Based on a Modified LDMOS Process on Bulk Silicon and Silicon-On-Insulator Substrates With Integrated Power Management Circuitry," IEEE Transactions on Microwave Theory and Techniques, Jun. 2012, vol. 60, No. 6, pp. 1862-1869.
Non-Final Office Action for U.S. Appl. No. 13/852,648, mailed Jul. 18, 2013, 20 pages.
Final Office Action for U.S. Appl. No. 13/852,648, mailed Nov. 26, 2013, 21 pages.
Advisory Action for U.S. Appl. No. 13/852,648 mailed Mar. 7, 2014, 4 pages.
Notice of Allowance for U.S. Appl. No. 13/852,648 mailed Jun. 16, 2014, 9 pages.
Notice of Allowance for U.S. Appl. No. 13/852,648 mailed Jan. 22, 2015, 8 pages.
Non-Final Office Action for U.S. Appl. No. 14/315,765, mailed Jan. 2, 2015, 6 pages.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly Thermally Conductive Plastics for Dielectric Heat Plates," Cool Polymers, Inc., 2006, 2 pages, http://www.coolpolymers.com/heatplate.asp.
Author Unknown, "Thermal Properties of Solids," PowerPoint Presentation, No Date, 28 slides, http://www.phys.hujl.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 3 pages, http://www.ctherm.com/products/tci_thermal_conductivity/helpful_links_tools/thermal_resistance_thermal_conductance/.

(56) References Cited

OTHER PUBLICATIONS

Lu, J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.

Niklaus, F., et al., "Adhesive Wafer Bonding," Journal of Applied Physics, vol. 99, No. 3, 031101 (2006), 28 pages.

Applicant-Initiated Interview Summary for U.S. Appl. No. 13/852,648, mailed Jan. 27, 2014, 3 pages.

Notice of Allowance for U.S. Appl. No. 13/852,648, mailed Sep. 26, 2014, 8 pages.

Non-Final Office Action for U.S. Appl. No. 13/852,648, mailed Jun. 24, 2015, 20 pages.

Advisory Action for U.S. Appl. No. 14/315,765, mailed Jul. 22, 2015, 3 pages.

Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.

Yamanaka, A., et al., "Thermal Conductivity of High-Strength Polytheylene Fiber and Applications for Cryogenic Use," International Scholarly Research Network, ISRN Materials Science, vol. 2011, Article ID 718761, May 25, 2011, 10 pages.

Final Office Action for U.S. Appl. No. 14/315,765, mailed May 11, 2015, 17 pages.

Non-Final Office Action for U.S. Appl. No. 14/260,909, mailed Mar. 20, 2015, 20 pages.

Final Office Action for U.S. Appl. No. 13/852,648, mailed Oct. 22, 2015, 20 pages.

* cited by examiner

Cool Polymers®
CoolPoly® D5506 THERMALLY CONDUCTIVE LIQUID CRYSTALLINE POLYMER (LCP)
CoolPoly D series of thermally conductive plastics transfers heat, a characteristic previously unavailable in injection molding grade polymers. CoolPoly is lightweight, netshape moldable and allows design freedom in applications previously restricted to metals. The D series is electrically non-conductive and can be used for its dielectric properties.

| THERMAL | SI/METRIC |
|---|---|
| THERMAL CONDUCTIVITY | 10 W/mK |
| THERMAL DIFFUSIVITY | 0.05 cm$^2$/sec |
| SPECIFIC HEAT | 1.0 J/g°C |
| COEFFICIENT OF LINEAR THERMAL EXPANSION | |
|     PARALLEL | 6.2 ppm/°C |
|     NORMAL | 5.6 ppm/°C |
| TEMPERATURE OF DEFLECTION | |
|     @ 0.45 MPa | >300 °C |
|     @ 1.80 MPa | 263 °C |
| FLAMMABILITY | V0 @ 1.0 mm |
| MECHANICAL | SI/METRIC |
| TENSILE MODULUS | 10900 MPa |
| TENSILE STRENGTH | 50 MPa |
| NOMINAL STRAIN @ BREAK | 0.7 % |
| FLEXURAL STRENGTH | 84 MPa |
| FLEXURAL MODULUS | 12300 MPa |
| IMPACT STRENGTH | |
|     CHARPY UNNOTCHED | 6.0 kJ/m$^2$ |
|     CHARPY NOTCHED | 3.2 kJ/m$^2$ |
| ELECTRICAL | SI/METRIC |
| SURFACE RESISTIVITY | 2.0E14 OHM/SQUARE |
| VOLUME RESISTIVITY | 1.6E14 OHM-CM |
| PHYSICAL | SI/METRIC |
| DENSITY | 1.80 g/cc |
| MOLD SHRINKAGE | |
|     FLOW | 0.1 % |
|     CROSS-FLOW | 0.3 % |

*FIG. 11*

PATTERNED SILICON-ON-PLASTIC (SOP) TECHNOLOGY AND METHODS OF MANUFACTURING THE SAME

RELATED APPLICATIONS

The present application claims priority to U.S. Provisional Patent Application No. 61/815,327, filed Apr. 24, 2013, and U.S. Provisional Patent Application No. 61/816,207, filed Apr. 26, 2013.

The present application claims priority to and is a continuation-in-part of U.S. patent application Ser. No. 13/852,648, filed Mar. 28, 2013, entitled "SEMICONDUCTOR DEVICE WITH A POLYMER SUBSTRATE AND METHODS OF MANUFACTURING THE SAME," which claims priority to U.S. Provisional Patent Application No. 61/773,490, filed Mar. 6, 2013.

The present application is related to concurrently filed U.S. patent application Ser. No. 14/260,909, entitled "SILICON-ON-DUAL PLASTIC (SODP) TECHNOLOGY AND METHODS OF MANUFACTURING THE SAME," which claims priority to U.S. Provisional Patent Application No. 61/816,207, filed Apr. 26, 2013.

All of the applications listed above are hereby incorporated herein by reference in their entireties.

FIELD OF THE DISCLOSURE

This disclosure relates to semiconductor devices and methods for manufacturing the same.

BACKGROUND

Radio frequency complementary metal oxide (RFCMOS) silicon-on-insulator (SOI) RF power switches are devices that are essential for practically every mobile handset currently on the market. Existing RFCMOS SOI technologies used to manufacture these devices provide excellent performance in increasingly complex multi-throw RF switches, tunable RF capacitance arrays, and antenna RF tuners. Conventional RFCMOS SOI technologies are built on high resistivity CMOS wafer handles that have resistivities ranging from 1000 Ohm-cm to 5000 Ohm-cm. A power switch employing RFCMOS SOI technology uses a high resistivity wafer handle so that a plurality of relatively low voltage field effect transistors (FETs) can be stacked while maintaining a desired isolation between the low voltage FETs.

In an RF switch application for third generation (3G) and fourth generation (4G) wireless applications, a high degree of RF device linearity and a relatively very low level of RF intermodulation under RF power conditions are crucial. Therefore, inherent nonlinearities in RF devices such as CMOS n-type field effect transistor (NFET) devices must be mitigated. Another source of nonlinearities is attributed to a high resistivity silicon handle wafer region interfaced with a buried oxide (BOX) dielectric region. One proposed solution for mitigating these nonlinearities includes a trap rich silicon/oxide interface that degrades carrier lifetimes in the silicon/oxide interface. Other proposed solutions for mitigating the nonlinearities due to the high resistivity handle region interfaced with the BOX dielectric region include harmonic suppression process techniques that include a series of process steps and heating treatments to minimize nonlinearities attributed to the high resistivity handle region interfaced with the BOX dielectric region. However, all the aforementioned proposed solutions add significant complexity and cost to CMOS SOI technology. What is needed are CMOS SOI-based semiconductor devices and methods for manufacturing CMOS SOI devices that do not produce the nonlinearities attributed to the high resistivity silicon handle region interfaced with the BOX dielectric region.

SUMMARY

A semiconductor device and methods for manufacturing the same are disclosed. The semiconductor device includes a semiconductor stack structure attached to a wafer handle having at least one aperture that extends through the wafer handle to an exposed portion of the semiconductor stack structure. A polymer substantially fills the at least one aperture and contacts the exposed portion of the semiconductor stack structure. The polymer is thermally conductive and electrically resistive.

In exemplary embodiments, a pattern of apertures extending through the wafer handle to exposed portions of the semiconductor stack structure are completely filled. In other exemplary embodiments, the polymer is further disposed on an external planar surface of the wafer handle to a predetermined thickness. In an additional embodiment, a silicon nitride layer covers portions of the semiconductor stack structure previously exposed during the formation of patterned apertures.

One method for manufacturing the semiconductor device includes forming the patterned apertures in the wafer handle to expose a portion of the semiconductor stack structure. The patterned apertures may or may not be aligned with sections of RF circuitry making up the semiconductor stack structure. A following step includes contacting the exposed portion of the semiconductor stack structure with a polymer and substantially filling the patterned apertures with the polymer, wherein the polymer is thermally conductive and electrically resistive. This step may continue to further dispose the polymer onto an external planar surface of the wafer handle. Another method adds a silicon nitride layer to cover the portions of the semiconductor stack structure before filling the patterned apertures with polymer.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIG. 11 is a specification table that lists thermal, mechanical, electrical, and physical specifications for an exemplary polymer material that is usable to form the polymer of the semiconductor device of the present disclosure.

DETAILED DESCRIPTION

Figure 1:
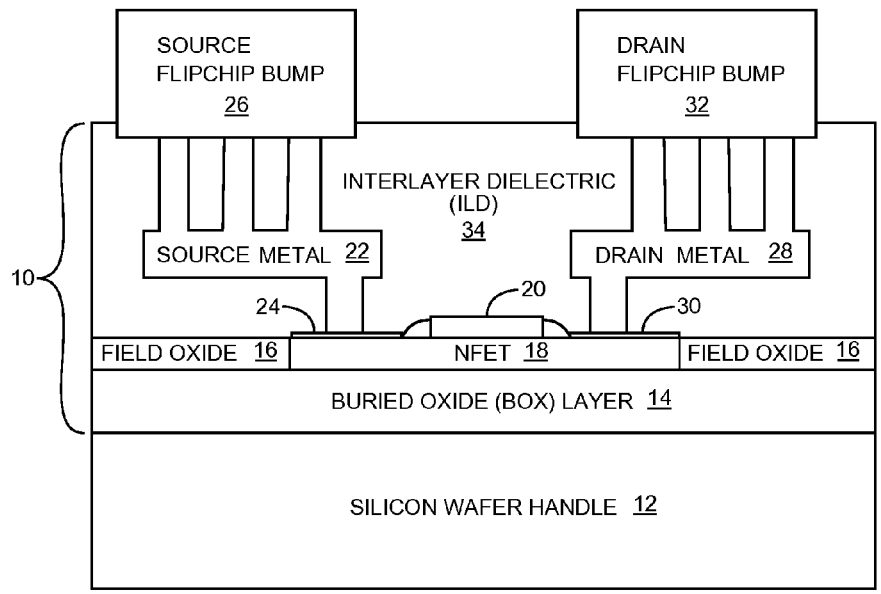
FIG. 1 is a cross-sectional diagram of a semiconductor stack structure interfaced with a relatively low resistivity silicon wafer handle.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "over," "on," "disposed on," "in," or extending "onto" another element, it can be directly over, directly on, directly disposed on, directly in, or extend directly onto the other element or intervening elements may also be present. In contrast, when an element is referred to as being "directly over," "directly on," "directly disposed on," "directly in," or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures. Moreover, the phrase "electrically resistive" used herein means having a resistance greater than $10^6$ Ohm-cm. Also, the phrase "thermally conductive" used herein means having a thermal conductivity greater than 2 watts per meter Kelvin (W/mK).

Traditional RFCMOS SOI technologies have reached a fundamental barrier due to limitations inherent to silicon wafer handles that prevent the relatively better insulating characteristics available in group IV, group III-V, or sapphire wafer handles. The disclosed semiconductor device replaces the silicon wafer handle with a polymer. As such, the semiconductor device of this disclosure eliminates the need for a high resistivity silicon wafer handle in a provided semiconductor stack structure.

Advanced silicon wafer handles for RF switch applications have resistivities that range from 1000 Ohm-cm to 5000 Ohm-cm and are significantly more costly than standard silicon wafer handles having much lower resistivities. Moreover, relatively complex process controls are needed to realize high resistivity in advanced silicon wafer handles. For these reasons, standard silicon wafer handles are used ubiquitously in standard SOI technologies. However, standard silicon wafer handles with their much lower resistivities are not conducive for stacking a plurality of relatively low voltage field effect transistors (FETs) while maintaining a desired isolation between the low voltage FETs. Fortunately, the polymer of the present disclosure replaces the silicon wafer handle and thus eliminates the problems associated with both high and low resistivity silicon wafer handles.

Additionally, the methods of the present disclosure allow for an immediate migration to 300 mm wafer handles for use in RF power switch applications. This is an important development since there is currently no commercially viable high volume supply of high resistivity RFSOI wafer handles in the 300 mm wafer diameter format. Fabricating the present semiconductor devices on 300 mm diameter wafer handles would provide a significant improvement in die costs. Moreover, the need for a trap rich layer and/or harmonic suppression techniques is eliminated, thereby resulting in a significantly simpler process flow and lower cost.

Further still, the polymer is expected to eliminate RF nonlinear effects resulting from the interface between the BOX layer and the silicon wafer handle used in traditional semiconductor processes to manufacture RF switch devices. The present methods realize RF switch devices that have linear characteristics relatively close to ideal linear characteristics.

Additionally, the semiconductor device of this disclosure offers a near ideal voltage stacking of NFET transistors. Traditionally, the number of NFET devices that can be stacked is limited by silicon wafer handle resistivity combined with the interface effects between the BOX layer and the silicon wafer handle. This issue essentially limits the number of practical NFET transistors that can be stacked and thus limits the highest RF operating voltage for the resulting NFET transistor stack. Replacing silicon wafer handles with the polymer of the present disclosure allows relatively many more NFET transistors to be practically ideally stacked. The resulting semiconductor device is operable at relatively much higher RF power levels and RMS voltages than is traditionally allowable on silicon handle wafer technologies.

Furthermore, the highest RF frequency of operation of RF power switches built with the disclosed polymer can be extended beyond the highest frequency of operation achievable with traditional RFCMOS SOI technologies. Typically, a silicon wafer handle resistivity is in the range of 1000-3000 Ohm-cm, which effectively imposes an operational high frequency limit. The resulting resistivity of the polymer of the semiconductor device taught in this disclosure is several orders of magnitude higher than what is achieved in high resistivity silicon. For instance, there are polymers with nearly ideal electrically insulating characteristics, with resistivity values similar to what is obtained in gallium arsenide (GaAs) and sapphire semi-insulating wafer handles.

FIG. 1 is a cross-sectional diagram of a semiconductor stack structure 10 interfaced with a relatively low resistivity silicon wafer handle 12. In the exemplary case of FIG. 1, the semiconductor stack structure 10 includes a buried oxide (BOX) layer 14, a field oxide layer 16, and an NFET device layer 18, with a gate 20. A source metal conductor 22 couples a source contact 24 with a source flipchip bump 26. Similarly, a drain metal conductor 28 couples a drain contact 30 with a drain flipchip bump 32. An interlayer dielectric (ILD) 34 protects the gate 20 and supports the source flipchip bump 26 and the drain flipchip bump 32.

Figure 2:
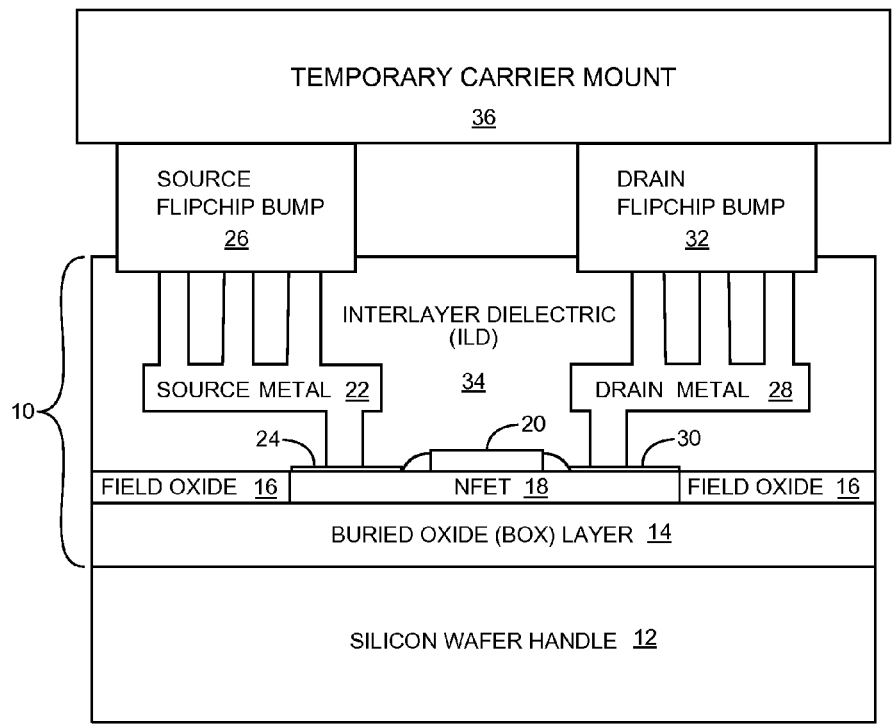
FIG. 2 is a cross-sectional diagram of the semiconductor stack structure with a temporary carrier mount for carrying the semiconductor stack structure during subsequent processing steps.

FIG. 2 is a cross-sectional diagram of the semiconductor stack structure 10 with a temporary carrier mount 36 for carrying the semiconductor stack structure 10 during subsequent processing steps. In this exemplary case, the temporary carrier mount 36 is attached to the source flipchip bump 26 and the drain flipchip bump 32. A goal of the temporary carrier mount 36 is to provide a good mechanical mount to the semiconductor stack structure 10 for further processing, and also for protecting a finished semiconductor device from being damaged by post process flows. A common technique for mounting to the temporary carrier mount 36 uses thick quartz carriers that have several through-holes that are attached to the finished SOI wafer handle using a specially designed ultraviolet (UV) adhesive tapes. This effectively bonds the temporary carrier to the source flipchip bump 26 and the drain flipchip bump 32. This mounting technique provides chemical and mechanical protection needed during a process to replace the silicon wafer handle 12 with a polymer. The mounting technique also allows for the easy dismount of a finished semiconductor device by a simple UV light exposure that makes the tape readily solvable in approved solvents. A number of other temporary carrier mount/dismount techniques are usable for the same purpose of providing chemical and mechanical protection needed during the process to replace the silicon wafer handle 12 with a polymer.

Figure 3:
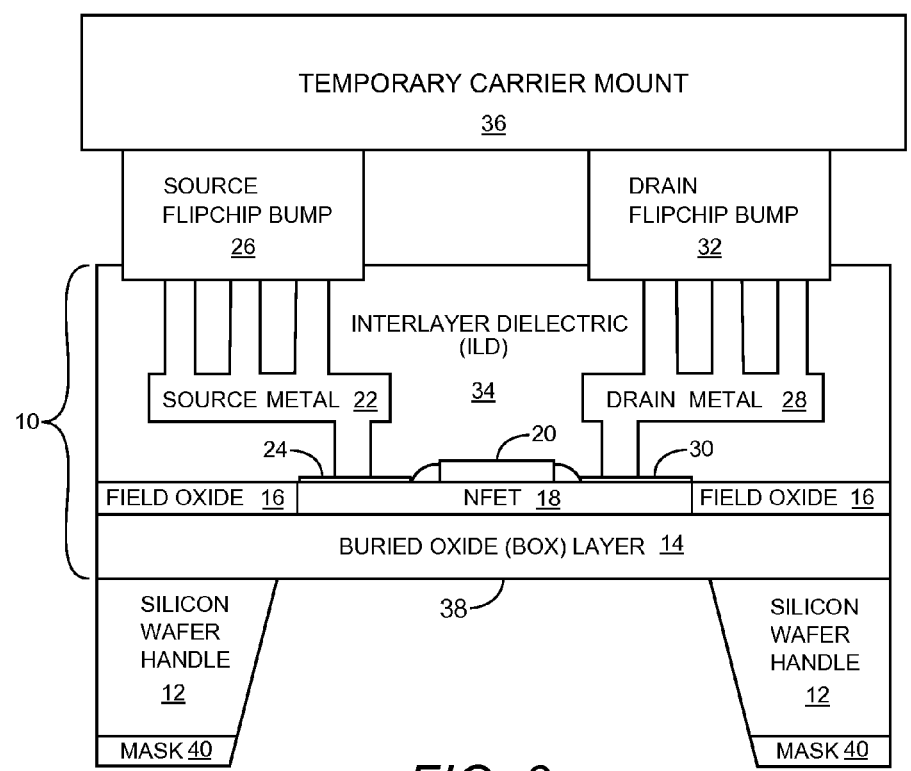
FIG. 3 is a cross-sectional diagram of the semiconductor stack structure after a portion of the relatively low resistivity silicon wafer handle has been removed.

FIG. 3 is a cross-sectional diagram of the semiconductor stack structure 10 after a patterned portion of the relatively low resistivity silicon wafer handle 12 has been removed. Once the semiconductor stack structure 10 is protected by the temporary carrier mount 36, the patterned portion of the silicon wafer handle 12 may be removed by a number of different techniques and may be preceded with a reduction in overall thickness of the silicon wafer handle 12 using a conventional grinding operation. For example, an original handle wafer thickness may be around 750 μm for a typical 200 mm wafer, and the grinding operation may remove most of the thickness leaving from around about 50 μm to around about 150 μm of the silicon wafer handle 12. Afterwards, the conventional grind operation is altered to remove only a patterned portion of the silicon wafer handle 12 followed by a chemical etch to remove any remaining parts of the patterned portion of the silicon wafer handle 12. The chemical etch is selectively stopped at a first surface 38 of the semiconductor stack structure 10. The result of the removal of a patterned portion of the silicon wafer handle 12 is at least one aperture that extends through the wafer handle to the first surface 38 of the semiconductor stack structure.

In this exemplary case, the first surface 38 is also an exposed surface of the BOX layer 14. The chemical etch can be implemented with a reactive ion etch and/or with potassium hydroxide. An aperture mask 40 may be applied to a back-side of the silicon wafer handle 12 to prevent etching some areas of the wafer, thus allowing the silicon etch process to be selective. The aperture mask 40 is patterned using standard semiconductor lithographic techniques, and is made up of deposited layers of material such as silicon dioxide or silicon nitride, or a combination of silicon dioxide and silicon nitride. Other techniques for removal of the silicon wafer handle 12 exist and are well documented in the literature. Some of these other techniques are based on dry or wet etch processes. The process used to remove the patterned portion of the silicon wafer handle 12 is not particularly relevant to the present disclosure. However, it is desirable for the removal of the patterned portion of the silicon wafer handle 12 to be accomplished without damaging the BOX layer 14 and the remainder of the semiconductor stack structure 10 as well as the source flipchip bump 26 and the drain flipchip bump 32.

Figure 4:
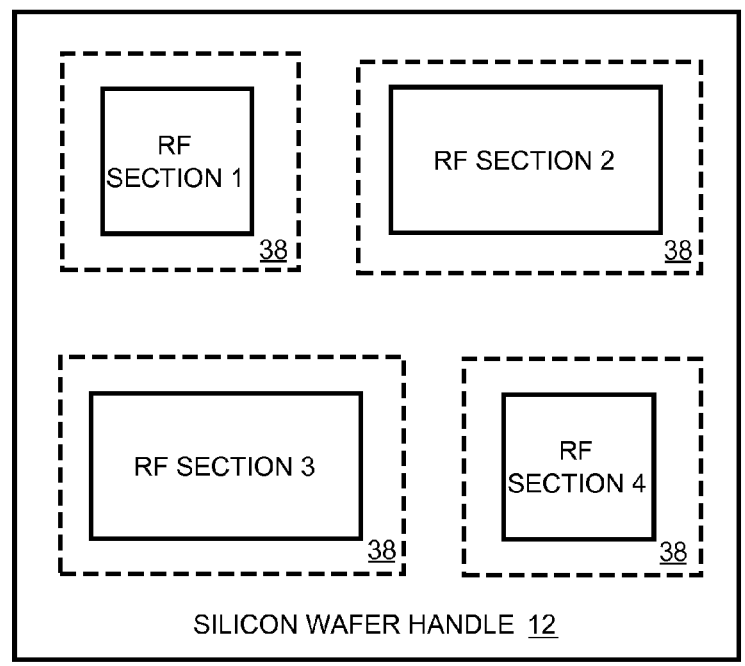
FIG. 4 is a plan view of a silicon wafer handle having portions removed in an irregular pattern to expose sections of RF circuitry.

FIG. 4 is a plan view of a silicon wafer handle 12 having apertures in an irregular pattern shown in dashed rectangles to expose sections of RF circuitry, such as RF SECTION 1, RF SECTION 2, RF SECTION 3, and RF SECTION 4. There are many different options for patterning the silicon wafer handle 12. For example, a pattern for silicon wafer handle 12 can be aligned with RF SECTION 1, RF SECTION 2, RF SECTION 3, and RF SECTION 4. Areas outside of the irregular pattern, shown in dashed rectangles, are left intact to retain mechanical strength. Alignment of the irregular pattern with RF SECTION 1, RF SECTION 2, RF SECTION 3, and RF SECTION 4 through mechanical and/or optical methods. However, mechanical alignment alone will suffice in some instances involving relatively large patterns.

Figure 5:
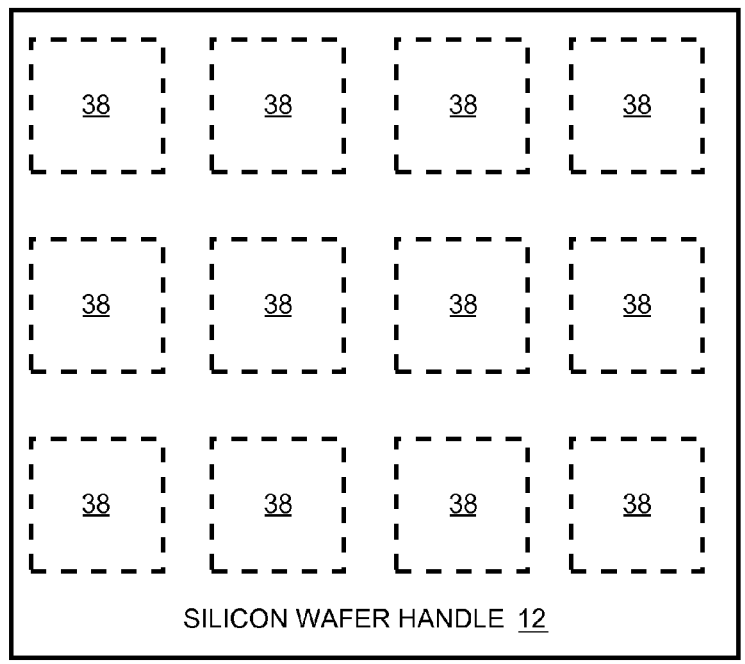
FIG. 5 is a plan view of a silicon wafer handle having portions removed in a repeating pattern that may or may not align with sections of RF circuitry.

FIG. 5 is a plan view of the silicon wafer handle 12 having portions removed to expose portions of the semiconductor stack structure 10 in a repeating pattern of rectangular apertures depicted in dashed line. In this case, the rectangular apertures may or may not align with sections of RF circuitry.

Figure 6:
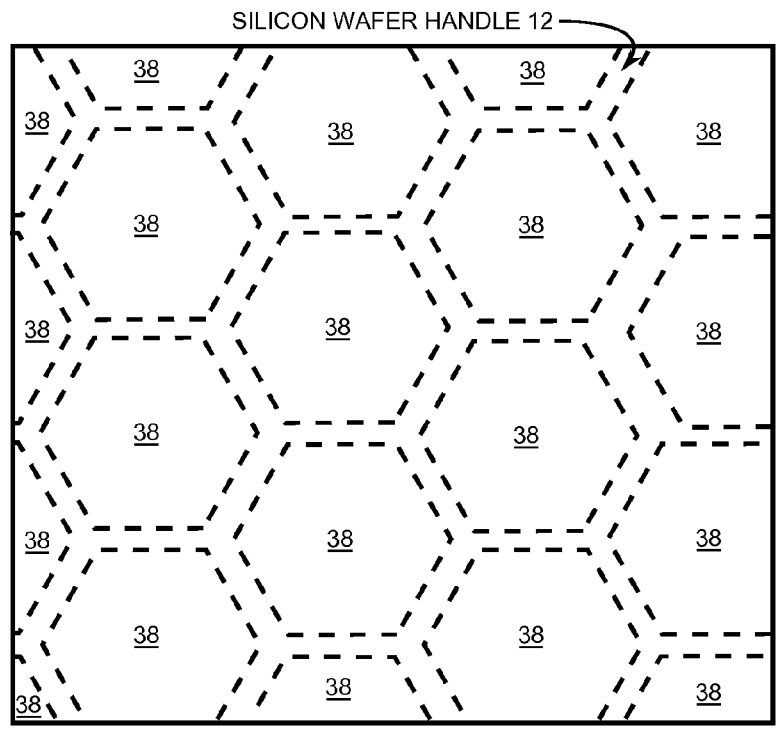
FIG. 6 is a plan view of a silicon wafer handle having portions removed in a repeating polygon pattern.

FIG. 6 is a plan view of the silicon wafer handle 12 having portions removed in a repeating pattern of polygons depicted in dashed lines. Like the embodiment of FIG. 5, the repeating pattern may or may not align with sections of RF circuitry. Moreover, the polygons may have N number of sides within N ranges from 3 to less than infinity. As N approaches infinity, the polygons approximate circles. In the case wherein N equals 4, the polygons take the form of quadrilaterals such as the rectangles depicted in dashed line in FIG. 5.

Figure 7:
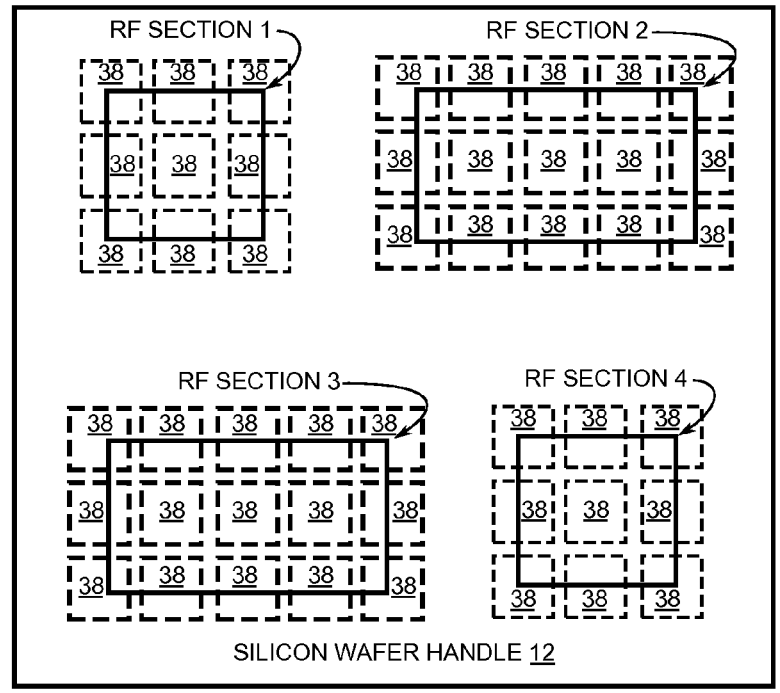
FIG. 7 is a plan view of a silicon wafer handle having portions removed in a repeating pattern that is aligned with sections of RF circuitry.

FIG. 7 is a plan view of the silicon wafer handle 12 having portions removed in a repeating pattern of rectangular apertures that is aligned with RF SECTION 1, RF SECTION 2, RF SECTION 3, and RF SECTION 4. While FIG. 7 depicts a repeating pattern of rectangular apertures, it is to be understood that a repeating pattern of apertures can have other shaped openings such as circles and irregular shapes. Moreover, the shaped openings can be various sizes.

Figure 8:
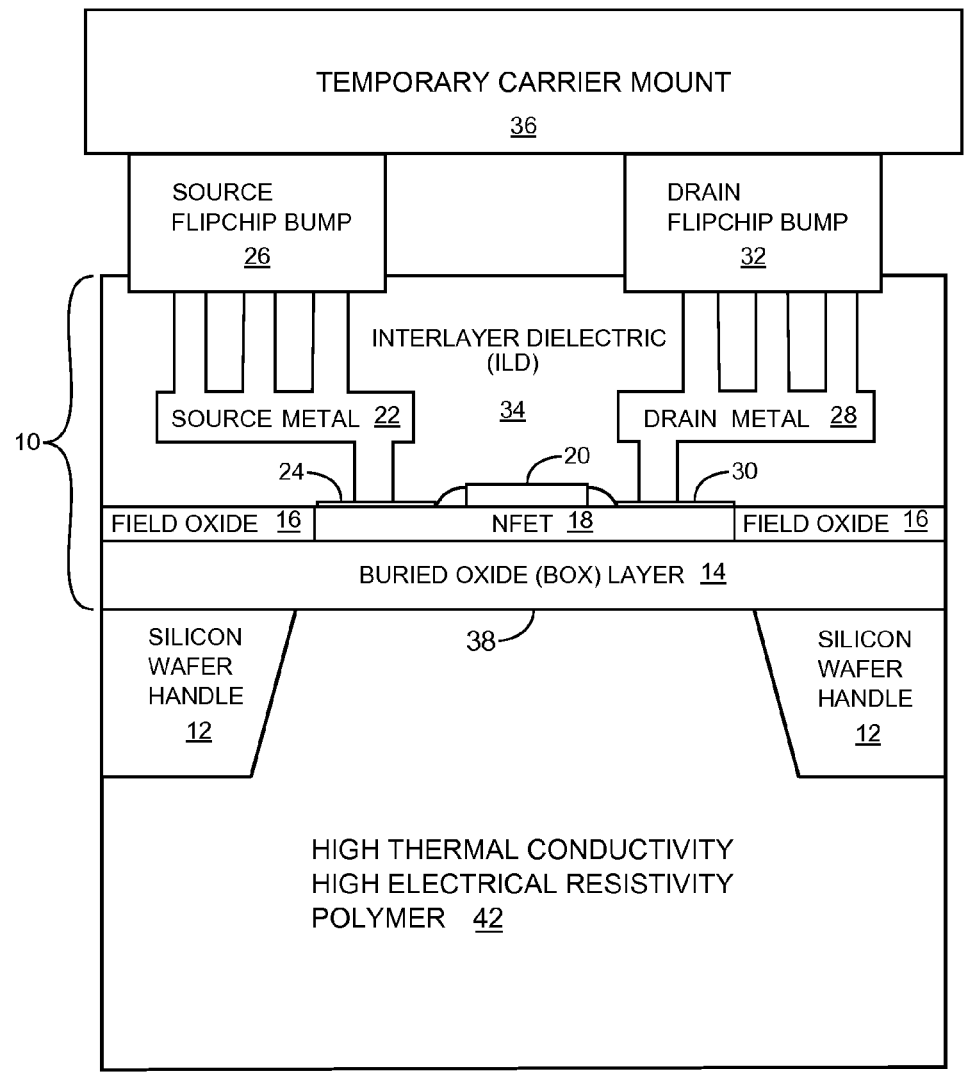
FIG. 8 is a cross-sectional diagram of the semiconductor stack structure after a polymer has been disposed on an exposed portion of the buried oxide (BOX) layer to realize the semiconductor device of the present disclosure.
Figure 10:
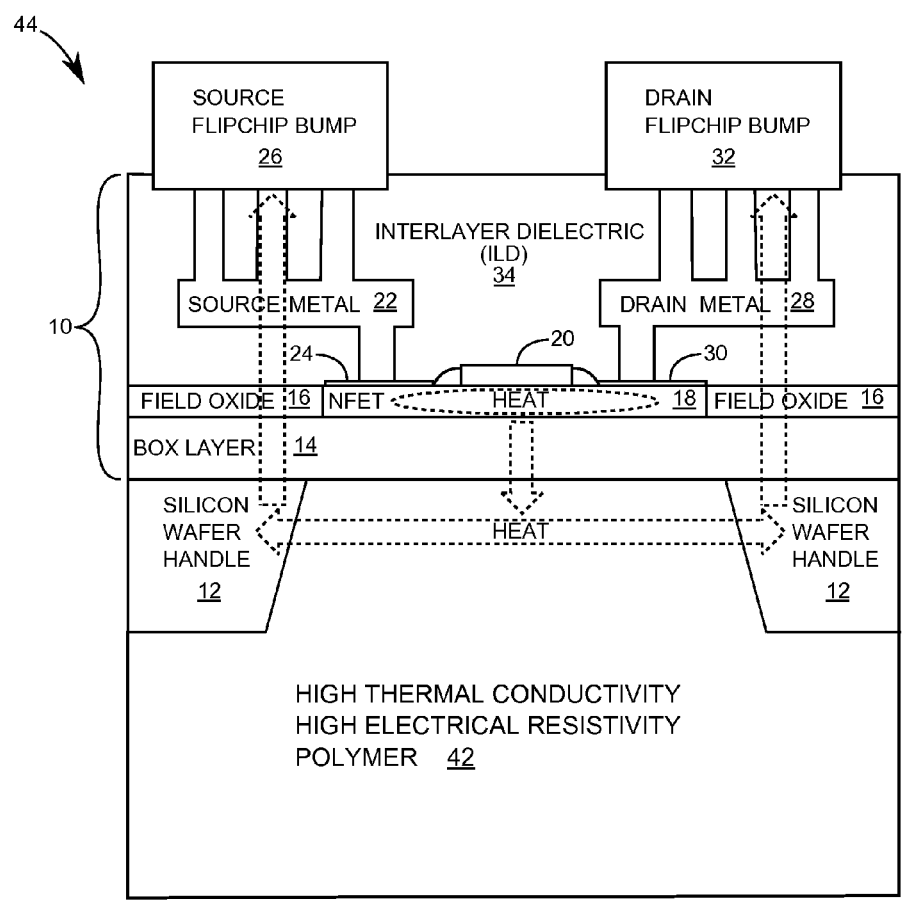
FIG. 10 is a cross-sectional diagram of the semiconductor device showing heat flow paths through the semiconductor device with the polymer after the semiconductor device has reached a steady state powered condition.

FIG. 8 is a cross-sectional diagram of the semiconductor stack structure 10 after a polymer 42 has been disposed on the exposed portion of the BOX layer 14 to realize a semiconductor device 44 (FIG. 10). The polymer material making up the polymer 42 has a unique set of characteristics in that the polymer material is both a relatively excellent electrical insulator and a relatively excellent heat conductor. Typical polymer materials making up common plastic parts are extremely poor conductors of heat. Poor heat conduction is a common characteristic of plastics normally used in an over-mold operation. However, there are engineered polymer materials that do provide relatively excellent heat conduction. Various formulations for such polymers yield thermal conductivities that range from greater than 2 Watts per meter Kelvin (W/mK) to around about 50 W/mK. In one embodiment, the thermal conductivity of the polymer ranges from around about 50 W/mK to around about 500 W/mK. Future enhancements in polymer science may provide additional improvements in terms of thermal conductivity while maintaining nearly ideal electrical insulating characteristics in the polymer. The structure of this disclosure benefits from the maximization of the polymer thermal conductivity and it should be understood that an upper bound of polymer thermal conductivity nears a theoretical thermal conductivity of carbon nanotubes and graphene, which is 6600 W/mK.

It is desirable that a polymer material usable for the polymer 42 be relatively strongly bondable to the first surface 38 of the semiconductor stack structure 10. For example, the polymer material needs a bonding strength that allows the semiconductor device 44 to be dismounted from the temporary carrier mount 36 and remain permanently bonded after additional processing steps as well as throughout the operational lifetime of the semiconductor device 44. Moreover, a desirable thickness for the polymer 42 ranges from around about 100 μm to around about 500 μm, but other desirable thicknesses for the polymer 42 can be thinner or thicker depending on the characteristics of the polymer material used to make up the polymer 42.

The polymer material making up the polymer 42 should also be a good electrical insulator. In general, the electrical resistivity of the polymer 42 should be at least $10^6$ Ohm-cm. In at least one embodiment, the polymer has a relatively high electrical resistivity that ranges from around about $10^{12}$ Ohm-cm to around about $10^{16}$ Ohm-cm. In combination with relatively high electrical resistivity, the thermal conductivity of the polymer 42 is on the order of the thermal conductivity of typical semiconductors, which is typically greater than 2 W/mK. In one embodiment, the thermal conductivity of the polymer 42 ranges from greater than 2 W/mK to around about 10 W/mK. In yet another embodiment, the thermal conductivity of the polymer 42 ranges from around about 10 W/mK to around about 50 W/mK. As polymer science provides materials with additional thermal conductivities, these materials can be utilized in the semiconductor device of this disclosure, as there are no upper bounds for how high the polymer thermal conductivity may be with regards to this disclosure.

Figure 9:
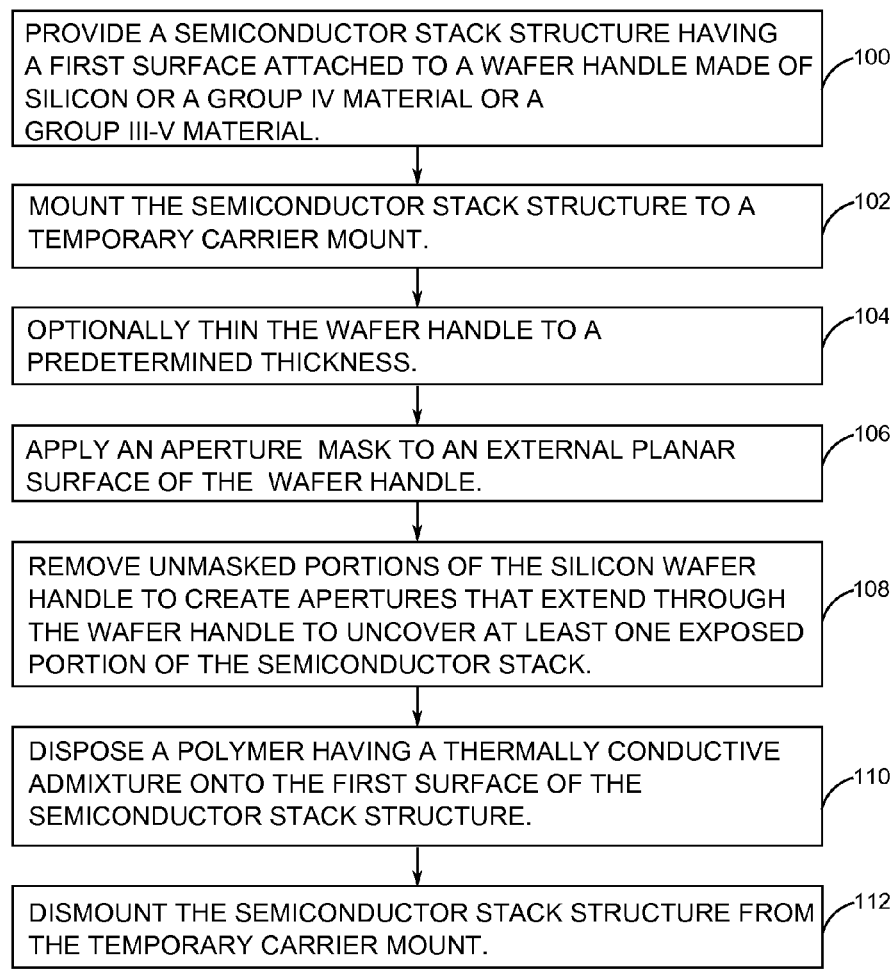
FIG. 9 is a process diagram that yields the semiconductor device having the polymer disposed on the exposed portion of the semiconductor stack structure.

FIG. 9 is a process diagram that yields the semiconductor device 44 having the polymer 42 disposed on the first surface 38 which in this case is an exposed portion of the semiconductor stack structure 10. However, it is to be understood that the exposed portion of the semiconductor stack structure 10 can be slightly deeper than the original first surface 38 depending on etch duration, etc. The exemplary process begins with providing the semiconductor stack structure 10 having the first surface 38 of the BOX layer 14 in direct contact with the silicon wafer handle 12 (step 100). While the semiconductor stack structure 10 is attached to the silicon wafer handle 12 at the beginning of the process, it is to be understood that a wafer handle made of other group IV or III-V semiconductors is also usable in place of the silicon wafer handle 12.

The semiconductor stack structure 10 is then mounted to the temporary carrier mount 36 with the source flipchip bump 26 and the drain flipchip bump 32 facing the temporary carrier mount 36 (step 102). Optionally, the silicon wafer handle 12 can be thinned to a predetermined thickness by grinding and/or etching (step 104). An exemplary thickness for the silicon wafer handle 12 after thinning is within a range of thickness from around about 50 μm to around about 150 μm. Further optionally, the aperture mask 40 can be applied to an external planar surface of the silicon wafer handle 12 (step 106). The process then continues by removing a portion of the silicon wafer handle 12 to form apertures to expose portions of the semiconductor stack structure 10 (step 108). The apertures can be formed via grinding and/or etching. The polymer 42 can then be attached to the first surface 38 of the semiconductor stack structure 10 using various polymer material disposing methods (step 110). Such methods for attaching the polymer 42 to the first surface 38 of the semiconductor stack structure 10 include, but are not limited to, injection molding, spin deposition, spray deposition, and pattern dispensing of polymer material directly onto the first surface 38 of the semiconductor stack structure 10. Once the polymer 42 is attached to the first surface 38 of the semiconductor stack structure 10, the temporary carrier mount 36 is dismounted (step 112).

The sequence of steps used in processes to manufacture the semiconductor device 44 will depend on the type of carrier and mounting processes used. There are a number of such processes available. A typical dismount step used extensively for through-substrate-via (TSV) processing includes exposing the UV adhesive tape that mounted the semiconductor stack structure 10 to a transparent quartz carrier to UV light, which alters the chemistry of the UV tape so that the semiconductor device 44 can be easily separated from the temporary carrier mount 36. The semiconductor device 44 can then be cleaned with common chemical solvents and/or plasma cleaning processes.

The semiconductor device 44 can then be singulated from an original wafer (not shown) into individual die by a number of different conventional processes. Typically, a saw operation that cuts through the semiconductor stack structure 10 and polymer 42 is the one method of die singulation. Other singulation methods such as laser sawing, laser scribing or diamond scribing can be used as alternatives.

It should be noted that the semiconductor device and methods taught in this disclosure begin with a conventionally manufactured RFSOI CMOS wafer which in this exemplary case is the semiconductor stack structure 10 disposed on the silicon wafer handle 12. However, one distinction is that there is no need for the silicon wafer handle 12 to have high resistivity, since the polymer 42 replaces substantial portions of the silicon wafer handle 12. If the semiconductor device 44 requires flipchip packaging, it should ideally already include the source flipchip bump 26 and the drain flipchip bump 32, although such a requirement may not be necessary depending on the specific characteristics of the bump or pillar packaging technology employed. In this exemplary case, it is assumed that a wafer process was completed through bumping.

FIG. 10 is a cross-sectional diagram of the semiconductor device 44 showing heat flow paths through the semiconductor device 44 with the polymer 42 after the semiconductor device 44 has reached a steady state powered condition. Under normal operation, heat is generated by energy losses in the NFET 18. An origin for the heat generated is represented by a dashed oval in the BOX layer 14 adjacent to the NFET 18. The flow of heat is represented by dashed arrows. As usual for high performance RF applications, the semiconductor device 44 is flipchip mounted in its final application. As such, the heat to be extracted is transferred by thermal conduction to the source flipchip bump 26 and the drain flipchip bump 32. Thermal analysis of typical SOI technologies indicates that unless the silicon wafer handle 12 (FIG. 1) is replaced with a good thermal conductive material, the NFET 18 quickly overheats under nominal conditions and essentially becomes very unreliable and likely fails. Under normal conditions and design rules, back-end-of-line metallization layers (not shown) provide too high a thermal resistance path to be used effectively as a means to dissipate the heat generated by the device. The polymer 42 accomplishes effectively the same function as the portions removed from the original silicon wafer handle 12 with respect to thermal management, while also providing much improved linear characteristics and effectively much higher electrical resistivity than the 1 kOhm-cm electrical resistivity of the silicon wafer handle 12.

FIG. 11 is a specification table that lists thermal, mechanical, electrical, and physical specifications for an exemplary polymer material that is usable to form the polymer 42 of the semiconductor device 44. The exemplary polymer material specified in the specification table of FIG. 11 is made by Cool Polymers® and is sold under the label "CoolPoly® D5506 Thermally Conductive Liquid Crystalline Polymer (LCP)." It is to be understood that the specification table of FIG. 11 only provides exemplary specifications and that a variety of mechanical and physical properties are available within the scope of the present disclosure. Moreover, the quantitative values for the thermal and electrical properties provided in the table of FIG. 11 only represent exemplary values that are within the range of thermal and electrical properties already discussed in the above disclosure. The polymer 42 is a thermoplastic such as polyamides that include nylon. Other suitable thermoplastics include, but are not limited to, Acrylonitrile Butadiene Styrene (ABS), Polyetheretherketone (PEEK) and Polysulfone. In other embodiments, the polymer 42 can be a thermoset plastic such as a two part epoxy resin. Moreover, the polymer 42 typically includes an admixture for increasing thermal conductivity. Examples of suitable thermal conductivity enhancing admixtures include ceramic powders, which include, but are not limited to boron nitride powder and aluminum nitride powder.

Figure 12:
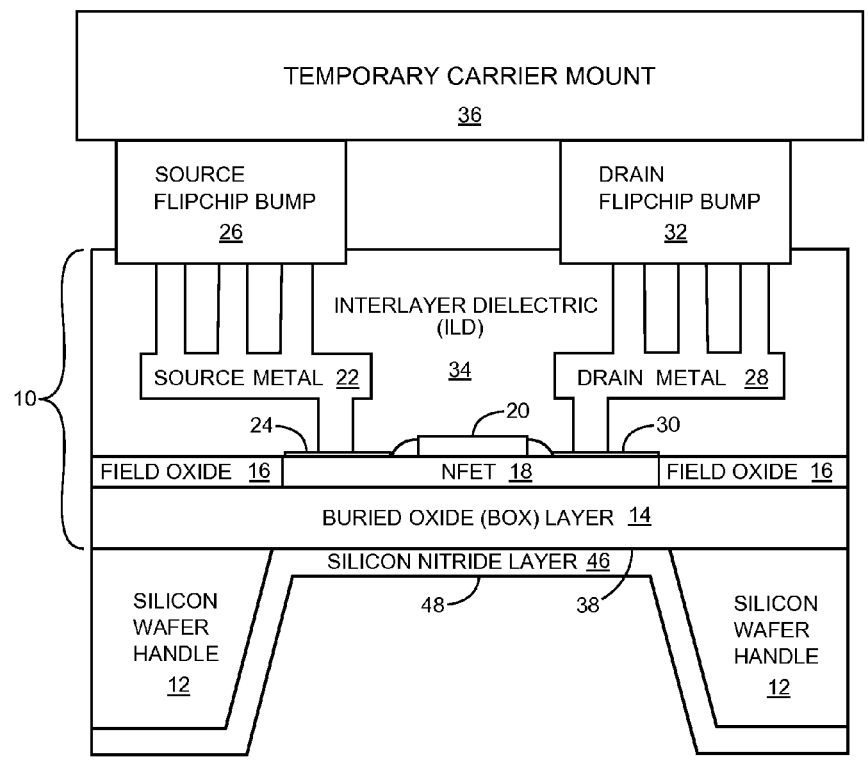
FIG. 12 is a cross-sectional diagram of the semiconductor stack structure after a portion of the relatively low resistivity silicon wafer handle has been removed and a silicon nitride layer is added.

FIG. 12 is a cross-sectional diagram of the semiconductor stack structure 10 after a portion of the relatively low resistivity silicon wafer handle 12 has been removed and a silicon nitride layer 46 is added. If an aperture mask such as aperture mask 40 (FIG. 3) is used to protect sections of the silicon wafer handle 12 from being etched, the aperture mask 40 can be removed before adding the silicon nitride layer 46. The removal of aperture mask 40 allows the silicon nitride layer 46 to conformally coat the silicon wafer handle 12 as well as the BOX layer 14.

Figure 13:
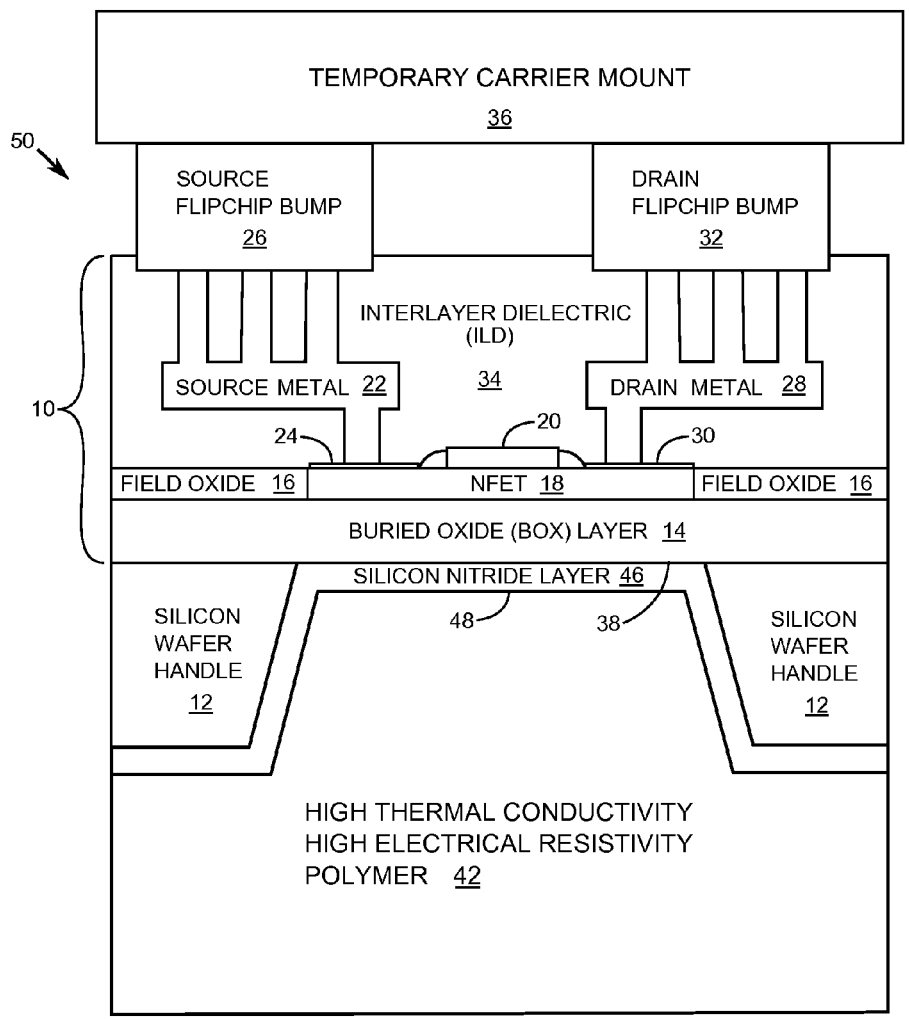
FIG. 13 is a cross-sectional diagram of the semiconductor stack structure after a polymer has been disposed on the silicon nitride layer.

FIG. 13 is a cross-sectional diagram of the semiconductor stack structure 10 after the polymer 42 has been disposed on an exterior surface 48 of the silicon nitride layer 46. In one respect, the silicon nitride layer 46 is an adhesion promoter for bonding the polymer 42 to the BOX layer 14. In another respect, the silicon nitride layer 46 prevents or at least resists a diffusion of moisture within the polymer 42 from reaching the BOX layer 14 or other critical device layers that may include complementary metal oxide semiconductor (CMOS) layers. The benefit of having a moisture barrier formed by the silicon nitride layer 46 is the prevention of a degradation of function of a semiconductor device 50.

The silicon nitride layer 46 may be deposited, as an example, via a plasma enhanced chemical vapor deposition (PECVD) system by the decomposition of silane and nitrogen gases, as commonly known to those skilled in the art. Such PECVD systems operate at temperatures typically between room temperature and 350° C. The silicon nitride layer 46 may also be deposited via other techniques including liquid phase chemical vapor deposition (LPCVD) and sputtered from a nitride target using RF sputtering. The silicon nitride layer 46 does not significantly impact the thermal conductivity provided by the polymer 42. In one embodiment, the thickness of the silicon nitride layer 46 ranges from around about 100 Å to around about 1000 Å. In another embodiment, the thickness of the silicon nitride layer 46 ranges from around about 1000 Å to around about 5000 Å. In yet another embodiment, the thickness of the silicon nitride layer 46 ranges from around about 5000 Å to around about 10,000 Å.

Figure 14:
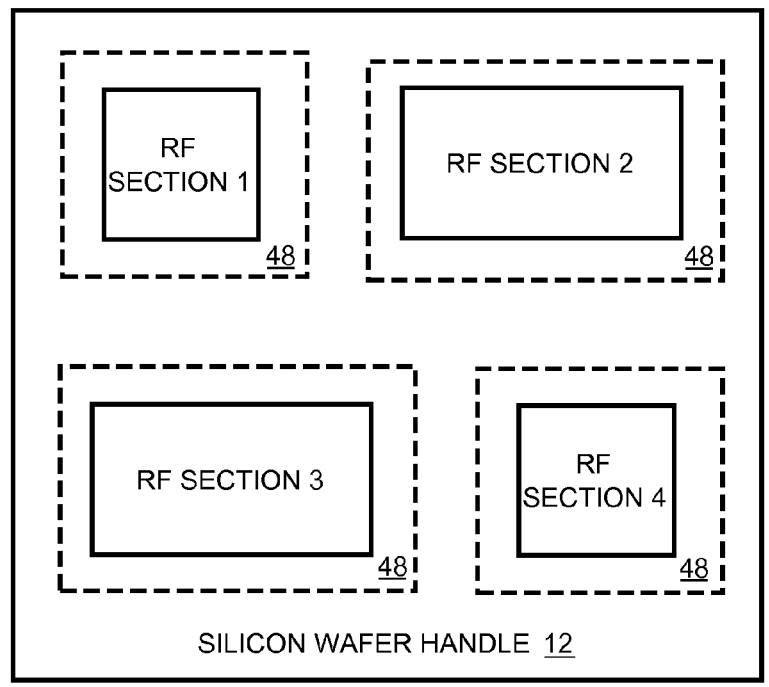
FIG. 14 is a plan view of a silicon wafer handle having portions removed in an irregular pattern to expose sections of RF circuitry that are then coated with the silicon nitride layer.

FIG. 14 is a plan view of the silicon wafer handle 12 having portions removed in an irregular pattern of apertures to expose sections of RF circuitry that are then coated with the silicon nitride layer 46. The apertures are shown in dashed rectangles to expose sections of RF circuitry, such as RF SECTION 1, RF SECTION 2, RF SECTION 3, and RF SECTION 4. There are many different options for patterning the silicon wafer handle 12. For example, a pattern for silicon wafer handle 12 can be aligned with RF SECTION 1, RF SECTION 2, RF SECTION 3, and RF SECTION 4. Areas outside of the irregular pattern, shown in dashed rectangles, are left intact to retain mechanical strength. Only exposed sections of RF circuitry will permanently include the silicon nitride layer 46, if the aperture mask 40 (FIG. 3) is left intact over the silicon wafer handle 12. Alternately, the aperture mask 40 can be removed before depositing the silicon nitride layer 46, in which case, the silicon wafer handle 12 will also be permanently coated by the silicon nitride layer 46.

Figure 15:
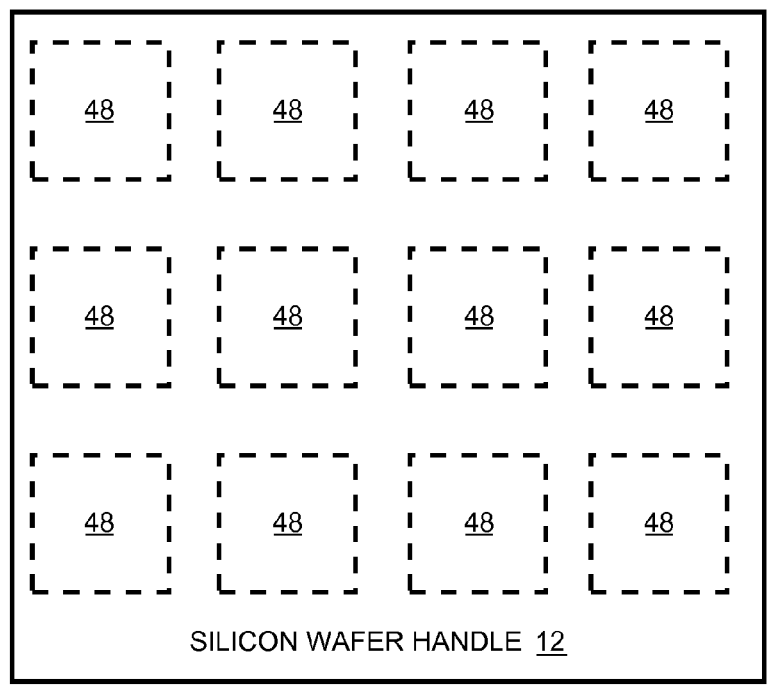
FIG. 15 is a plan view of a silicon wafer handle having portions removed in a repeating pattern that includes the silicon nitride layer.

FIG. 15 is a plan view of the silicon wafer handle 12 having portions removed to expose portions of the semiconductor stack structure 10 in a repeating pattern of rectangular apertures depicted in dashed line. In this case, the rectangular apertures may or may not align with sections of RF circuitry. As with FIG. 14, only apertures will permanently include the silicon nitride layer 46, if the aperture mask 40 (FIG. 3) is left intact over the silicon wafer handle 12. Alternately, the aperture mask 40 can be removed before depositing the silicon nitride layer 46, in which case, the silicon wafer handle 12 will also be permanently coated by the silicon nitride layer 46.

Figure 16:
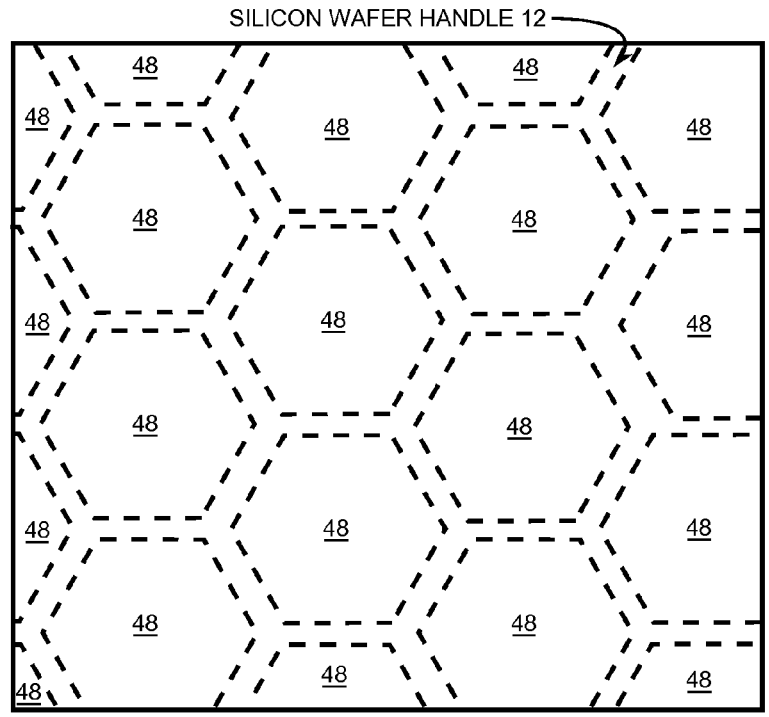
FIG. 16 is a plan view of a silicon wafer handle having portions removed in a repeating polygon pattern that includes the silicon nitride layer.

FIG. 16 is a plan view of the silicon wafer handle 12 having portions removed in a repeating pattern of polygons depicted in dashed lines. Like the embodiment of FIG. 15, the repeating pattern may or may not align with sections of RF circuitry. Moreover, the polygons may have N number of sides wherein N ranges from 3 to less than infinity. As N approaches infinity, the polygons approximate circles. In the case wherein N equals 4, the polygons take the form of quadrilaterals such as the rectangles depicted in dashed line in FIG. 15. The sections exposed within the repeating pattern of polygons are permanently coated with the silicon nitride layer 46. The silicon wafer handle 12 can also be permanently coated with the silicon nitride layer 46 provided the aperture mask 40 (FIG. 3) is removed.

Figure 17:
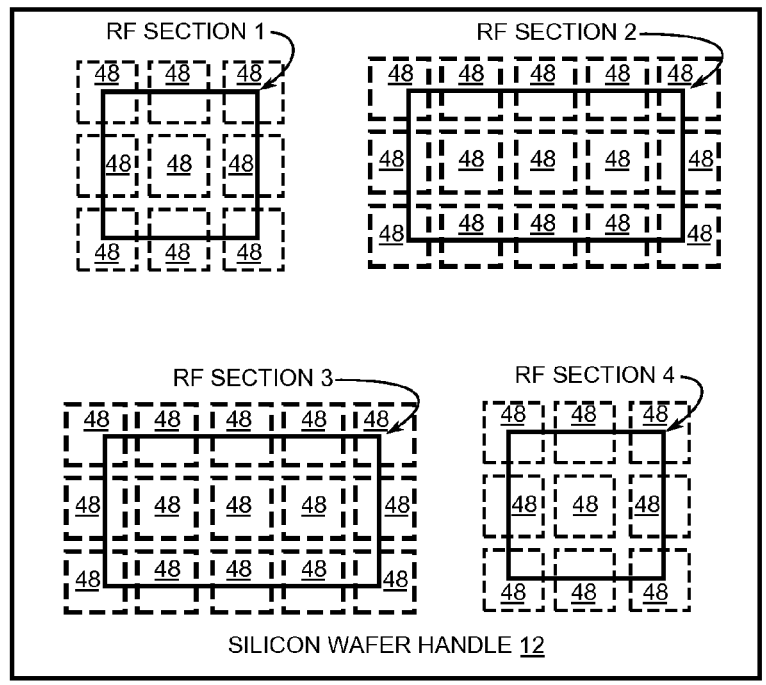
FIG. 17 is a plan view of a silicon wafer handle having portions removed in a repeating pattern that is aligned with sections of RF circuitry that are coated with the silicon nitride layer.

FIG. 17 is a plan view of the silicon wafer handle 12 having portions removed in a repeating pattern of rectangular apertures that is aligned with RF SECTION 1, RF SECTION 2, RF SECTION 3, and RF SECTION 4. While FIG. 17 depicts a repeating pattern of rectangular apertures, it is to be understood that a repeating pattern of apertures can have other shaped openings such as circles and irregular shapes. Moreover, the shaped openings can be various sizes. Sections exposed within the repeating pattern of rectangular apertures are permanently coated with the silicon nitride layer 46. As in the other embodiments shown in FIGS. 14 through 16, the silicon wafer handle 12 can also be permanently coated with the silicon nitride layer 46 provided the aperture mask 40 (FIG. 3) is removed.

Figure 18:
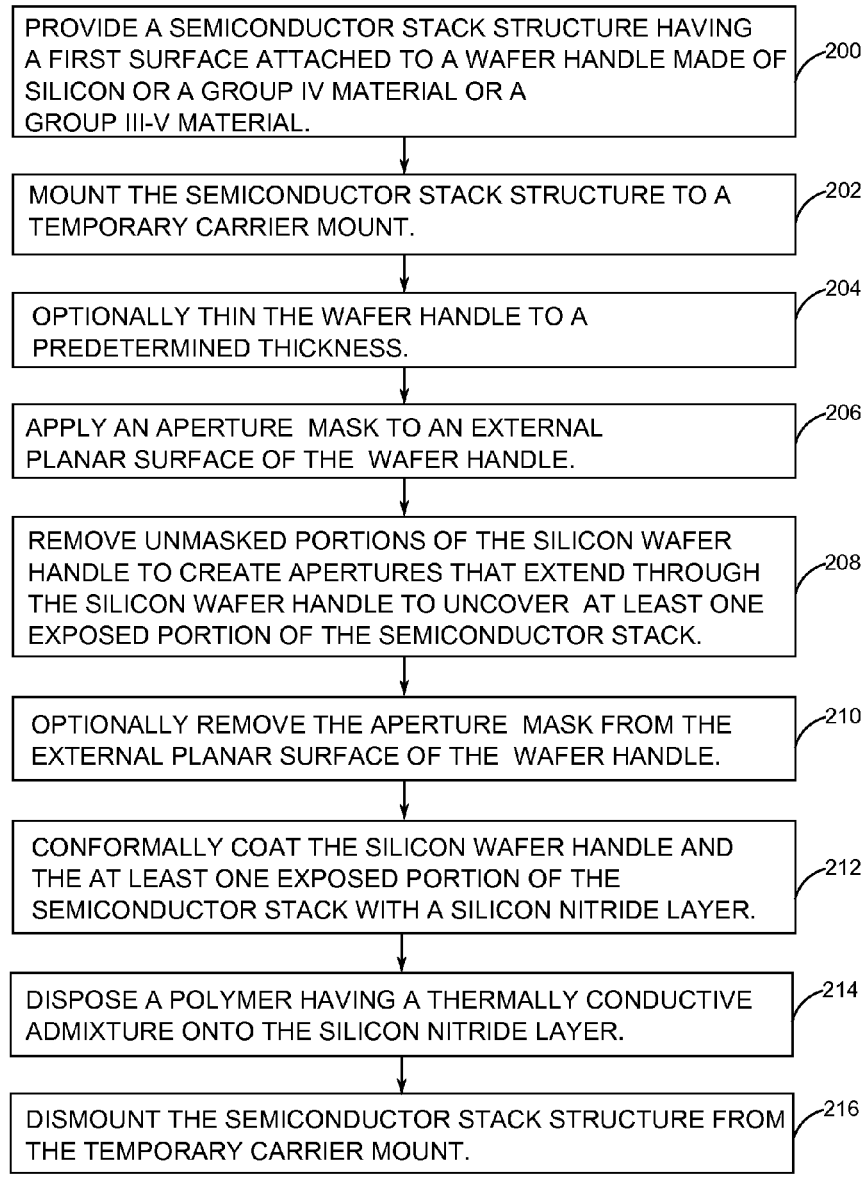
FIG. 18 is a process diagram that yields a semiconductor device having the polymer disposed on the silicon nitride layer that covers portions of the semiconductor stack structure previously exposed during the formation of apertures.

FIG. 18 is a process diagram that yields the semiconductor device 50 having the polymer 42 disposed on the exterior surface 48 of the silicon nitride layer 46. The exemplary process begins with providing the semiconductor stack structure 10 having the first surface 38 of the BOX layer 14 in direct contact with the silicon wafer handle 12 (step 200). While the semiconductor stack structure 10 is attached to the silicon wafer handle 12 at the beginning of the process, it is to be understood that a wafer handle made of other group IV or III-V semiconductors is also usable in place of the silicon wafer handle 12.

The semiconductor stack structure 10 is then mounted to the temporary carrier mount 36 with the source flipchip bump 26 and the drain flipchip bump 32 facing the temporary carrier mount 36 (step 202). Optionally, the silicon wafer handle 12 can be thinned to a predetermined thickness by grinding and/or etching (step 204). An exemplary thickness for the silicon wafer handle 12 after thinning is within a range of around about 50 µm to around about 150 µm. Further optionally, the aperture mask 40 can be applied to an external planar surface of the silicon wafer handle 12 (step 206). The process then continues by removing a portion of the silicon wafer handle 12 to form apertures to expose portions of the semiconductor stack structure 10 (step 208). The apertures can be formed via grinding and/or etching. The aperture mask 40 may optionally be removed from the external planar surface of the wafer handle 12 (step 210). Next, the at least one exposed portion of the semiconductor stack 10 is conformally coated with the silicon nitride layer 46 (step 212). The polymer 42 can then be adhered to the silicon nitride layer 46 using various polymer material disposing methods (step 214). Such methods for attaching the polymer 42 to the first surface 38 of the semiconductor stack structure 10 include, but are not limited to, injection molding, spin deposition, spray deposition, and pattern dispensing of polymer material directly onto the first surface 38 of the semiconductor stack structure 10. Once the polymer 42 is attached to the first surface 38 of the semiconductor stack structure 10, the temporary carrier mount 36 is dismounted (step 216).

Those skilled in the art will recognize improvements and modifications to the embodiments of the present disclosure. All such improvements and modifications are considered within the scope of the concepts disclosed herein and the claims that follow.

What is claimed is:

1. A semiconductor device comprising:
    a semiconductor stack structure;
    a wafer handle attached to the semiconductor stack structure and having a pattern of polygon-shaped openings that extends through the wafer handle to an exposed portion of the semiconductor stack structure, wherein the polygon-shaped openings each have N number of sides, wherein N is a positive counting number greater than 2 and less than infinity; and
    a polymer substantially filling the polygon-shaped openings and contacting the exposed portion of the semiconductor stack structure, wherein the polymer is thermally conductive and electrically resistive.

2. The semiconductor device of claim 1 wherein the polymer is further disposed on an external planar surface of the wafer handle.

3. The semiconductor device of claim 2 wherein the polymer has a thickness that ranges from around about 100 µm to around about 500 µm.

4. The semiconductor device of claim 1 wherein the polymer includes an admixture for increasing thermal conductivity of the polymer.

5. The semiconductor device of claim 1 wherein the polymer is a thermoplastic.

6. The semiconductor device of claim 1 wherein the polymer is a thermoset plastic.

7. The semiconductor device of claim 1 wherein the wafer handle has a thickness that ranges from around about 50 µm to around about 150 µm.

8. The semiconductor device of claim 1 wherein the openings within the pattern of polygon-shaped openings are of substantially different sizes.

9. The semiconductor device of claim 1 wherein the pattern of polygon-shaped openings is aligned over select sections of RF circuitry making up the semiconductor stack structure.

10. The semiconductor device of claim 1 wherein a thermal conductivity of the polymer ranges from greater than 2 watts per meter Kelvin (W/mK) to around about 10 W/mK.

11. The semiconductor device of claim 1 wherein a thermal conductivity of the polymer ranges from around about 10 W/mK to around about 50 W/mK.

12. The semiconductor device of claim 1 wherein a thermal conductivity of the polymer ranges from around about 50 W/mK to around about 500 W/mK.

13. The semiconductor device of claim 1 wherein an electrical resistivity of the polymer ranges from greater than $10^6$ Ohm-cm to around about $10^{12}$ Ohm-cm.

14. The semiconductor device of claim 1 wherein an electrical resistivity of the polymer ranges from around about $10^{12}$ Ohm-cm to around about $10^{16}$ Ohm-cm.

15. The semiconductor device of claim 1 further comprising a silicon nitride layer deposited on the exposed portion of the semiconductor stack structure between the polymer and the semiconductor stack structure.

16. The semiconductor device of claim 15 wherein a thickness of the silicon nitride layer ranges from greater than 100 Å to around about 5000 Å.

17. A method of manufacture for a semiconductor device comprising:
    providing a semiconductor stack structure attached to a wafer handle;
    forming a pattern of polygon-shaped openings that extends through the wafer handle to an exposed portion of the semiconductor stack structure, wherein the polygon-shaped openings each have N number of sides, wherein N is a positive counting number greater than 2 and less than infinity; and
    contacting the exposed portion of the semiconductor stack structure with a polymer and substantially filling the polygon-shaped openings with the polymer.

18. The method of claim 17 wherein the semiconductor device further includes flipchip bumps on a side of the semiconductor stack structure that is opposite the wafer handle.

19. The method of claim 18 further including mounting a temporary carrier mount to the flipchip bumps after providing the semiconductor stack structure and before forming the pattern of polygon-shaped openings that extends through the wafer handle.

20. The method of claim 19 further including thinning the wafer handle to within a range of thickness from around about 50 μm to around about 150 μm.

21. The method of claim 20 further including applying a pattern mask to prevent removal of select areas of the wafer handle during forming of the pattern of polygon-shaped openings in the wafer handle to uncover the exposed portion of the semiconductor stack structure.

22. The method of claim 17 further including disposing the polymer onto an external planar surface of the wafer handle.

23. The method of claim 17 wherein the openings within the pattern of polygon-shaped openings are of substantially different sizes.

24. The method of claim 17 wherein the pattern of polygon-shaped openings is aligned over select sections of RF circuitry making up the semiconductor stack structure.

25. The method of claim 17 wherein a thermal conductivity of the polymer ranges from greater than 2 watts per meter Kelvin (W/mK) to around about 10 W/mK.

26. The method of claim 17 wherein a thermal conductivity of the polymer ranges from around about 10 W/mK to around about 50 W/mK.

27. The method of claim 17 wherein a thermal conductivity of the polymer ranges from around about 50 W/mK to around about 500 W/mK.

28. The method of claim 17 wherein an electrical resistivity of the polymer ranges from greater than $10^6$ Ohm-cm to around about $10^{12}$ Ohm-cm.

29. The method of claim 17 wherein an electrical resistivity of the polymer ranges from around about $10^{12}$ Ohm-cm to around about $10^{16}$ Ohm-cm.

30. The method of claim 17 further comprising depositing a silicon nitride layer onto the exposed portion of the semiconductor stack structure between the polymer and the semiconductor stack structure.

31. The method of claim 30 wherein a thickness of the silicon nitride layer ranges from greater than 100 Å to around about 5000 Å.

* * * * *